United States Patent
Cheng (10) Patent No.: US 9,269,800 B2
(45) Date of Patent: Feb. 23, 2016

(54) ENHANCED DEVICE AND MANUFACTURING METHOD THEREFOR

(71) Applicant: Enkris Semiconductor, Inc., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 0 days.

(21) Appl. No.: 14/394,649

(22) PCT Filed: Mar. 29, 2013

(86) PCT No.: PCT/CN2013/073434
§ 371 (c)(1),
(2) Date: Oct. 15, 2014

(87) PCT Pub. No.: WO2013/155930
PCT Pub. Date: Oct. 24, 2013

(65) Prior Publication Data
US 2015/0097194 A1   Apr. 9, 2015

(30) Foreign Application Priority Data
Apr. 17, 2012 (CN) .......................... 2012 1 0112988

(51) Int. Cl.
| H01L 29/778 | (2006.01) |
| H01L 29/66 | (2006.01) |
| H01L 29/10 | (2006.01) |
| H01L 29/20 | (2006.01) |
| H01L 29/205 | (2006.01) |

(52) U.S. Cl.
CPC .......... *H01L 29/778* (2013.01); *H01L 29/1066* (2013.01); *H01L 29/2003* (2013.01); *H01L 29/205* (2013.01); *H01L 29/66431* (2013.01); *H01L 29/66462* (2013.01); *H01L 29/7786* (2013.01)

(58) Field of Classification Search
None
See application file for complete search history.

(56) References Cited

U.S. PATENT DOCUMENTS 6,057,565 A * 5/2000 Yoshida et al. ............... 257/102

FOREIGN PATENT DOCUMENTS

| CN | 101211969 A | 7/2008 |
| CN | 101416290 A | 4/2009 |
| CN | 101740384 A | 6/2010 |

(Continued)

OTHER PUBLICATIONS

International Search Report for PCT/CN2013/073434 Jul. 18, 2013.

*Primary Examiner* — Stanetta Isaac
(74) *Attorney, Agent, or Firm* — Pearne & Gordon LLP (57) ABSTRACT

An enhancement-mode device comprises: a substrate, an epitaxial multilayer structure formed on the substrate, and a gate region formed on the epitaxial multilayer structure, where the epitaxial multilayer structure sequentially comprises from the substrate: a nucleation layer, a buffer layer, a heterojunction structure layer, a second gallium nitride layer, a nitride transition layer and a dielectric layer, where the heterojunction structure layer comprises a gallium nitride channel layer and a barrier layer which has a sandwich structure, and a middle layer of the sandwich structure is a first gallium nitride layer; and the gate region comprises a gate metal layer and a p-type nitride layer located under the gate metal layer, wherein the p-type nitride layer is embedded into the epitaxial multilayer structure, a bottom of the p-type nitride layer is in contact with the first gallium nitride layer of the sandwich structure.

20 Claims, 8 Drawing Sheets (56) References Cited

FOREIGN PATENT DOCUMENTS

| CN | 102239551 | A | 11/2011 |
| CN | 102280494 | A | 12/2011 |
| CN | 102683394 | A | 9/2012 |
| JP | 2008098455 | A | 4/2008 |

* cited by examiner

FIG. 1

PRIOR ART

FIG. 2

PRIOR ART

ENHANCED DEVICE AND MANUFACTURING METHOD THEREFOR

This application is the US national phase of International Application No. PCT/CN2013/073434 filed on Mar. 29, 2013, which claims the priority to Chinese Patent Application No. 201210112988.1, entitled "ENHANCEMENT-MODE DEVICE AND METHOD FOR FABRICATING ENHANCEMENT-MODE DEVICE", filed with the Chinese Patent Office on Apr. 17, 2012, both of which are hereby incorporated by reference in their entireties.

FIELD

The present disclosure belongs to the technical field of microelectronics, and relates to an enhancement mode device and a method for fabricating the enhancement-mode device, and particularly to an enhancement-mode device achieved by selectively growing a p-type nitride layer.

BACKGROUND

Gallium nitride, which is a semiconductor material, has become a research focus at present because of its features such as a wide band gap, a high saturation drift velocity of electron, a high breakdown field strength and a good thermal conductivity. In terms of electronic devices, gallium nitride is more preferable for manufacturing devices at high-temperature, high-frequency, high-voltage and high-power as compared with silicon and gallium arsenide. Thus, the electronic device based on gallium nitride has a good prospect.

Since a two-dimensional electron gas is formed in the AlGaN/GaN heterojunction structure, a High Electron Mobility Transistor (HEMT) generally made by AlGaN/GaN heterojunction is naturally a depletion device. It is not straightforward to achieve an enhancement-mode device using AlGaN/GaN hetero-structures. However, the depletion-mode device has its limitation in many applications. For example, an enhancement-mode (normally-off) switching device is needed in the application of the power switching device due to safety requirements. The research of enhancement-mode gallium nitride switching devices has important significance, because it has a great potential in high-frequency, power switching, digital circuit applications and the like.

Figure 1:
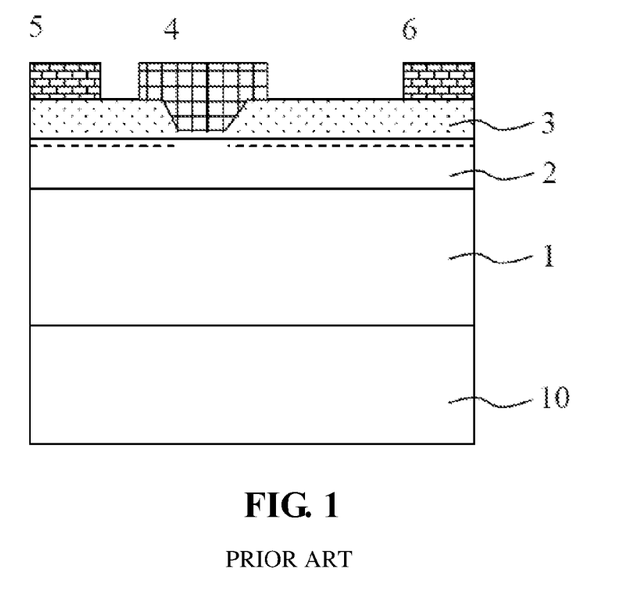
FIG. 1 is a schematic structural diagram of an enhancement-mode device achieved by reducing locally the thickness of an aluminum gallium nitride layer on a gate electrode in the conventional technology.
Figure 2:
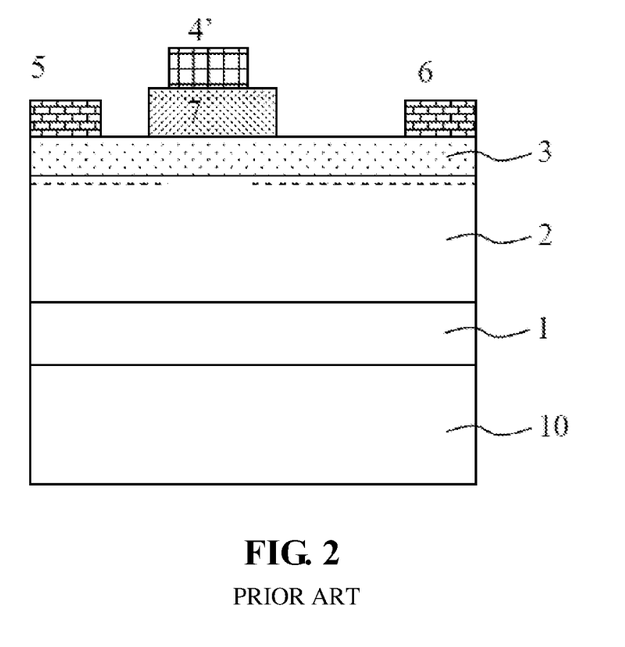
FIG. 2 is a schematic structural diagram of an enhancement-mode device achieved by retaining selectively a p-type nitride under the gate electrode in the conventional technology.

It is necessary to find a method for reducing the carrier concentration in the channel under the gate electrode in the case that the gate voltage is zero, to achieve the enhancement-mode gallium nitride switching device. A first method is to provide an etching structure under the gate electrode and reduce locally the thickness of an aluminum gallium nitride layer under the gate electrode, to control or minimize the concentration of two-dimensional electron gas under the gate electrode. As shown in FIG. 1, a buffer layer 1, a gallium nitride layer 2 and an aluminum gallium nitride layer 3 are sequentially located on a substrate 10; and a gate electrode 4, a source electrode 5 and a drain electrode 6 are located on the aluminum gallium nitride layer 3. The aluminum gallium nitride layer under the gate electrode 4 is etched locally, and thus the thickness of the aluminum gallium nitride layer in a gate region is reduced. A second method is to form a p-type nitride under the gate electrode, Fermi level in the AlGaN/GaN hetero-structure is pulled up by the p-type nitride (Al)GaN to form a depletion region, and thus the enhancement-mode device is achieved. A portion of a p-type nitride 7 under a gate electrode 4' is retained selectively, as shown in FIG. 2.

However, these two methods have some disadvantages. In the first method, the threshold voltage is generally in the range of 0V to 1V, which does not reach the applied threshold voltage of 3V to 5V. To achieve a higher threshold voltage, it is needed to provide an additional dielectric layer, such as an aluminium oxide layer formed by atomic layer deposition. But, it is an issue how to control the interface states between the dielectric layer and the AlGaN surface. In the second method, it is necessary to remove the planar p-type GaN over the AlGaN barrier layer. It is difficult to achieve the precise control of the etching depth. Furthermore, defects due to etching and the residual magnesium atom from the p-type aluminum gallium nitride may lead to severe current collapse. In addition, the concentration of the two-dimensional electron gas in the AlGaN/GaN heterojunction is limited since the hole concentration is low (in general, the hole concentration of the p-type gallium nitride is not larger than $1E18/cm^3$). If the electron concentration of the two-dimensional electron gas is too high to be depleted, the enhancement-mode device can not be achieved. Therefore, the composition of aluminum in the AlGaN/GaN heterojunction of the enhancement-mode device is generally less than 20%, for example, about 15%.

SUMMARY

In view of the above, an object of the present disclosure is to provide an enhancement-mode device and a method for fabricating the enhancement-mode device in which a heterojunction is formed by using gallium nitride semiconductor, to avoid current collapse effect caused by defects due to etching the p-type nitride in the above second method, and achieving the precise control of the threshold voltage of the enhancement-mode device in the present disclosure.

One object of the present disclosure is to provide an enhancement-mode device. The enhancement-mode device includes: a substrate, an epitaxial multilayer structure formed on the substrate, and a gate region formed on the epitaxial multilayer structure, where the epitaxial multilayer structure sequentially includes from the substrate: a nucleation layer, a buffer layer, a heterojunction structure layer, a second gallium nitride layer, a nitride transition layer and a dielectric layer, where the heterojunction structure layer includes a gallium nitride channel layer and a barrier layer which has a sandwich structure, and a middle layer of the sandwich structure is a first gallium nitride layer; and the gate region includes a gate metal layer and a p-type nitride layer located under the gate metal layer, where the p-type nitride layer is embedded into the epitaxial multilayer structure, a bottom of the p-type nitride layer is in contact with the first gallium nitride layer of the sandwich structure, and a top of the p-type nitride layer is not higher than the nitride transition layer.

Preferably, an aluminum nitride layer may be provided between the barrier layer and the gallium nitride channel layer.

Preferably, a first outer layer of the sandwich structure close to the gallium nitride channel layer may be one of an aluminum gallium nitride layer and an aluminum indium gallium nitride layer, and a second outer layer of the sandwich structure far away from the gallium nitride channel layer may be one of an aluminum gallium nitride layer and an aluminum indium gallium nitride layer.

Preferably, the aluminum composition in the first outer layer is less than 30% and a thickness of the first outer layer is less than 10 nm.

Preferably, the aluminum composition in the first outer layer may be less than 20% and a thickness of the first outer layer may be less than 15 nm.

Preferably, a thickness of the second gallium nitride layer may be larger than 10 nm.

Preferably, the second gallium nitride layer may be an undoped layer, an n-type doped layer or an n-type modulated-doped layer.

Preferably, the gate metal layer may have a "T" shape.

Preferably, the p-type nitride may be aluminum indium gallium nitride, indium gallium nitride or gallium nitride.

Preferably, the substrate may be made of one of sapphire, silicon carbide, silicon, lithium niobate, silicon-on-insulator, gallium nitride and an aluminum nitride.

Preferably, the dielectric layer may be one of SiN, $SiO_2$, SiON, $Al_2O_3$, $HfO_2$ and $HfAlO_x$, or a combination thereof.

The other object of the present disclosure is to propose a method for fabricating the enhancement-mode device described above. The method includes:
1) forming sequentially, on the substrate, the nucleation layer, the buffer layer, the gallium nitride channel layer, the first outer layer, the first gallium nitride layer, the second outer layer, the second gallium nitride layer, the nitride transition layer and the dielectric layer to form the epitaxial multilayer structure;
2) etching locally the epitaxial multilayer structure to expose the first gallium nitride layer by taking the first gallium nitride layer as an etching stop layer to form the gate region;
3) forming the p-type nitride layer in the gate region by selective area growth using the dielectric layer as a mask layer, wherein the bottom of the p-type nitride layer is in contact with the first gallium nitride layer, and the top of the p-type nitride layer is not higher than the nitride transition layer; and
4) depositing the gate metal layer in the gate region to form a gate electrode.

Preferably, an aluminum nitride layer may be provided between the barrier layer and the gallium nitride channel layer.

Preferably, the first outer layer of the sandwich structure close to the gallium nitride channel layer may be an aluminum gallium nitride layer or an aluminum indium gallium nitride layer; and the second outer layer of the sandwich structure far away from the gallium nitride channel layer may be an aluminum gallium nitride layer or an aluminum indium gallium nitride layer.

In the present disclosure, the precise control of the threshold voltage is achieved by the selective etching and the selective growth in the gate region. Furthermore, since the method of selective area growth is used instead of a plasma etching process, the damage to the material caused by the etching is reduced. In addition, the process is easy to be performed and the device has a higher stability and reliability.

DETAILED DESCRIPTION

As described in the background, it is necessary to minimize the carrier concentration in the channel when the gate voltage is zero in a gallium nitride based enhancement-mode device. However, in the conventional technology, the threshold voltage is limited in the case that the thickness of an aluminum gallium nitride layer under the gate electrode is reduced. Furthermore, in the case that a portion of the p-type nitride under the gate electrode is retained, the current collapse is caused by defects due to etching the p-type nitride in the source region and the drain region.

To solve the issue that it is difficult to control the threshold voltage in the enhancement-mode device caused by the two issues described above, a method for growing selectively a p-type nitride layer under the gate electrode is proposed, instead of the local etching process. Thus, the issue of defects caused by the local etching process is avoided, and the object of the precise control of the threshold voltage is achieved.

The technical solution of the present disclosure is described below in detail in conjunction with the specific embodiments.

Figure 3:
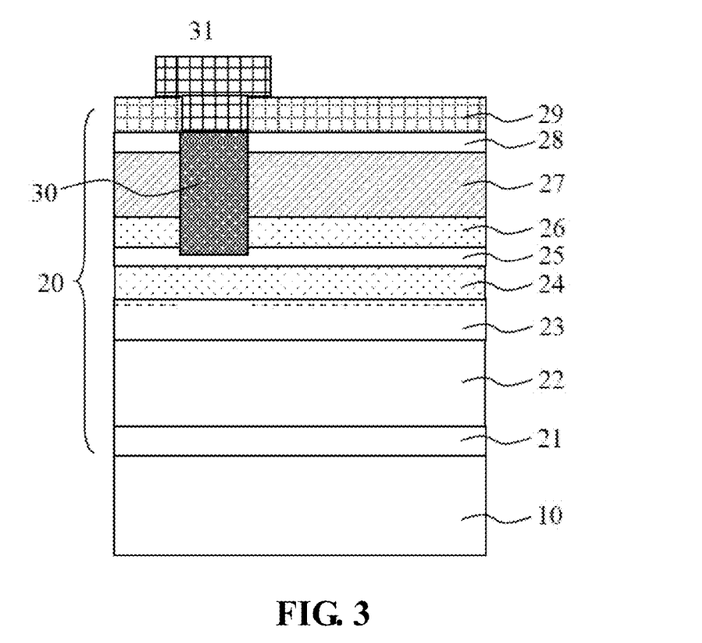
FIG. 3 is a schematic structural diagram of an enhancement-mode device according to a first embodiment of the present disclosure.

As shown in FIG. 3, which is a schematic structural diagram of an enhancement-mode device according to a first embodiment of the present disclosure, the enhancement-mode device provided by the present disclosure includes a substrate 10, an epitaxial multilayer structure 20 formed on the substrate, and a gate region formed on the epitaxial multilayer structure.

The substrate 10 may be made of one of sapphire, silicon carbide, silicon, lithium niobate, silicon-on-insulating, gallium nitride and aluminum nitride.

The epitaxial multilayer structure 20 sequentially includes from a side near the substrate 10: a nucleation layer 21, a buffer layer 22, a gallium nitride channel layer 23, a first outer layer 24, a first gallium nitride layer 25, a second outer layer 26, a second gallium nitride layer 27, a nitride transition layer 28 and a dielectric layer 29.

Specifically, the nucleation layer 21 has an influence on crystal quality, surface morphology, electrical properties and the like of a heterojunction above. The nucleation layer 21 may be changed depending on the material of the substrate 20, and mainly function to match with the substrate and a semiconductor layer in the heterojunction structure.

The buffer layer 22 not only functions to adhere to the semiconductor layer to be formed, but also functions to protect the substrate 20 from meltback etching. In this disclosure, the buffer layer 22 is an (Al)GaN layer in which a content of aluminium is controllable.

The gallium nitride channel layer 23, together with a barrier layer which is located above the gallium nitride channel layer 23 and has a sandwich structure, forms the heterojunction structure. The gallium nitride channel layer 23 provides a channel for movement of two-dimensional electron gas, and the sandwich structure functions as a barrier. In this sandwich structure, the first gallium nitride layer 25 is a middle layer sandwiched between the first outer layer 24 and the second outer layer 26. The first gallium nitride layer 25 is an innovation of the present disclosure, and the first gallium nitride layer 25 may function as a stopper layer during the subsequent local etching process. Therefore, the first gallium nitride layer 25 may protect the first outer layer 24 located above the gallium nitride channel layer 23 from being damaged by the etching process.

The first outer layer 24 is close to the gallium nitride channel layer 23, and the first outer layer 24 may be an aluminum gallium nitride layer or an aluminum indium gallium nitride layer (the composition of aluminum, indium or gallium ranges from 0 to 1).

The second outer layer 26 is on top of the gallium nitride channel layer 23, and the second outer layer 26 may be an aluminum gallium nitride layer or an aluminum indium gallium nitride layer with the composition of aluminum, indium or gallium ranging from 0 to 1.

The thickness of the second gallium nitride layer 27 should be generally greater than 10 nm, greater than 30 nm, or even greater than 120 nm. The second gallium nitride layer 27 may be an undoped layer, an n-type doped layer or an n-type modulated-doped layer. The second gallium nitride layer 27 can not only make the epitaxial film heterojunction stable, but also can prevent the silicon atom in the dielectric layer 29 from diffusing into the p-type gallium nitride. And a gate electrode structure having a "T" shape may be obtained by controlling the growth thickness.

The nitride transition layer 28 may be a gallium nitride layer, an aluminum gallium nitride layer or an aluminum indium gallium nitride layer. The nitride transition layer 28 functions to match with a surface layer to be formed.

The dielectric layer 29 functions as a passivation layer. The dielectric layer 29 further functions as a mask in the subsequent process of growing the p-type nitride, to achieve the selective growth of the p-type nitride layer. The dielectric layer 29 may be made of one of SiN, $SiO_2$, SiON, $Al_2O_3$, $HfO_2$ and $HfAlO_x$, or a combination thereof. The dielectric layer 29 may be grown in situ inside an MOCVD chamber, or may be grown by LPCVD, ALD or PECVD.

The gate region includes a gate metal layer 31 and a p-type nitride layer 30 located under the gate metal layer 31. The gate metal layer 31 has a "T" shape, and the p-type nitride layer 30 is embedded into the epitaxial multilayer structure. The bottom of the p-type nitride layer is in contact with the first gallium nitride layer of the sandwich structure, and the top of the p-type nitride layer 30 is not higher than the nitride transition layer. The p-type nitride layer 30 is one of an aluminum indium gallium nitride layer, an indium gallium nitride layer, and gallium nitride layer.

Figure 4:
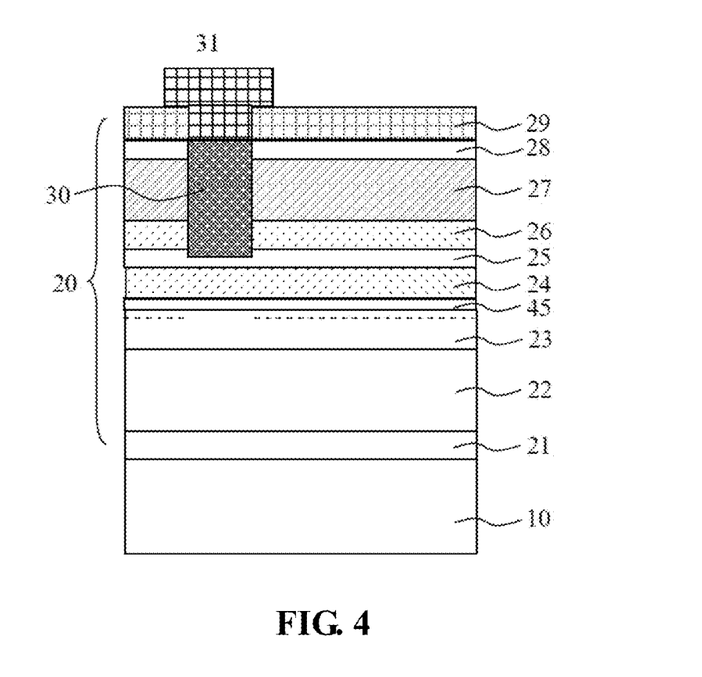
FIG. 4 is a schematic structural diagram of an enhancement-mode device according to a second embodiment of the present disclosure.

FIG. 4 shows a schematic structural diagram of an enhancement-mode device according to a second embodiment of the present disclosure. An aluminum nitride layer 45 is provided between the barrier layer and the gallium nitride channel layer according to this embodiment. The aluminum nitride layer 45 functions to control further the majority carrier concentration of the channel by adjusting the band of the conduction band, to achieve the depletion layer in the case that the gate voltage is zero. The others are the same as the first embodiment, which is not described here.

The method for fabricating the enhancement-mode device described above is described below in detail in conjunction with the specific embodiment.

As shown in FIG. 5A to FIG. 5D, which are state diagrams of a method for fabricating the enhancement-mode device according to the first embodiment of the present disclosure, the method includes the following steps S11 to S14.

Figure 5A:
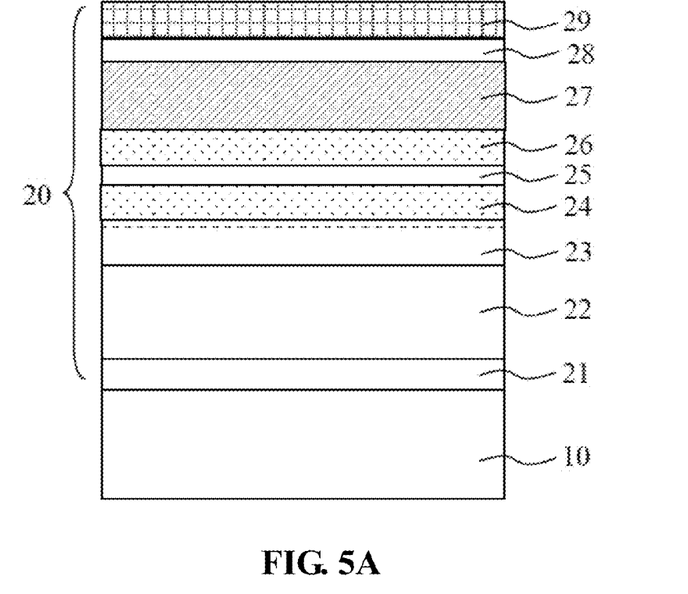
FIG. 5A to FIG. 5D are flow diagrams of a method for fabricating the enhancement-mode device according to the first embodiment of the present disclosure.

In step S11: first, as shown in FIG. 5A, the nucleation layer 21, the buffer layer 22, the gallium nitride channel layer 23, the first aluminum gallium nitride layer 24, the first gallium nitride layer 25, the second aluminum gallium nitride layer 26, the second gallium nitride layer 27, the nitride transition layer 28 and the dielectric layer 29 are formed sequentially on the substrate 10 to form the epitaxial multilayer structure.

In this step, the substrate 10 may be made of one of sapphire, silicon carbide, silicon, lithium niobate, silicon-on-insulator, gallium nitride and aluminum nitride.

The nucleation layer 21 has influence on crystal quality, surface morphology, electrical properties and the like of a heterojunction above composed of GaN/AlGaN. The nucleation layer 21 may be changed depending on the material of the substrate 10, and mainly function to match with the substrate and the gallium nitride layer.

The buffer layer 22 not only functions to adhere to the gallium nitride channel layer 23, but also functions to protect the substrate 20 from invasion of metal ion. In this disclosure, the buffer layer 22 is a gallium nitride (Al) GaN layer in which a content of aluminium is controllable.

The gallium nitride channel layer 23, together with a barrier layer which has a sandwich structure, forms the heterojunction structure. A first outer layer, a middle layer and a second outer layer of the sandwich structure are respectively the first aluminum gallium nitride layer 24, the first gallium nitride layer 25, and the second aluminum gallium nitride layer 26. The gallium nitride channel layer 23 provides a channel for movement of the two-dimensional electron gas, and the sandwich structure functions as a barrier.

In this sandwich structure, the first gallium nitride layer 25 sandwiched between the first aluminum gallium nitride layer 24 and the second aluminum gallium nitride layer 26 is an innovation of the present disclosure, and the first gallium nitride layer 25 may function as a stopper layer during the subsequent local etching process. Therefore, the first gallium nitride layer 25 may protect the first outer layer 24 located above the gallium nitride channel layer 23 from being damaged by the etching process.

The second gallium nitride layer 27 has a great thickness. Generally, the thickness of the second gallium nitride layer 27 is greater than 10 nm, greater than 30 nm, or even greater than 120 nm. The second gallium nitride layer 27 can not only make the epitaxial film heterojunction stable, but also can prevent the silicon atoms in the dielectric layer 29 from diffusing into the p-type gallium nitride. And a gate electrode structure having a "T" shape may be obtained by controlling the growth thickness.

The nitride transition layer 28 may be a gallium nitride layer, an aluminum gallium nitride layer or an aluminum indium gallium nitride layer. The nitride transition layer 28 functions to match with the surface layer to be formed.

The dielectric layer 29 functions as a passivation layer. The dielectric layer 29 further functions as a mask in the subsequent process of growing the p-type nitride, to achieve the selective growth of the p-type nitride layer. The dielectric layer 29 may be grown in situ inside an MOCVD chamber, or may be grown by LPCVD, ALD or PECVD.

In step S12: as shown in FIG. 5, the epitaxial multilayer structure is etched locally by taking the first gallium nitride layer as a stop layer, to form the gate region by exposing the first gallium nitride layer.

Figure 5B:
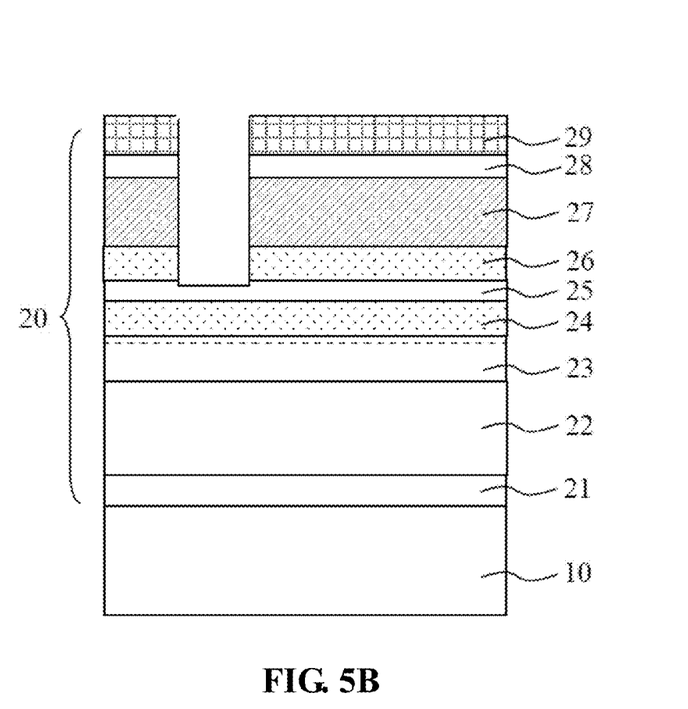

In this step, the etching process may be wet etching or dry etching. The etching is performed to etch through the second aluminum gallium nitride layer 26, and stopped till the first gallium nitride layer 25 is exposed. Since the gallium nitride does not affect the two-dimensional electron gas, the etching for the first gallium nitride layer 25 has no or a little influence on the threshold voltage. Therefore, the requirement for the accuracy of the etching process for the product quality may be decreased. For example, in the case that the first gallium nitride layer 25 has the thickness of 10 nm, it may have a freedom of 10 nm for the etching rate, as long as the first gallium nitride layer 25 is not etched through. As described above, the first gallium nitride layer 25 may further function to protect the first aluminum gallium nitride layer 24 below in the process of selectively growing the p-type gallium nitride, thus the first aluminum gallium nitride layer 24 may be prevented from releasing stress at high temperature, and defects generated are reduced.

Figure 5C:
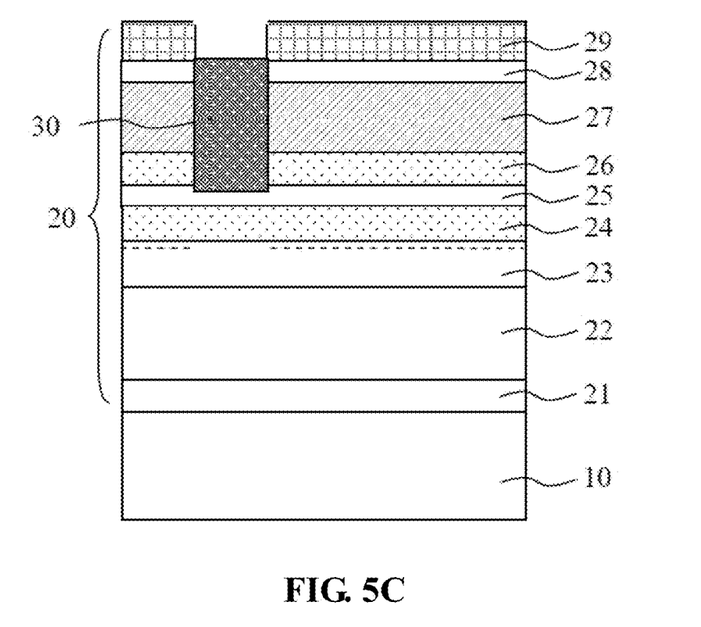

In step S13: as shown in FIG. 5C, the p-type nitride layer 30 is formed in the gate region through a selective growth by taking the dielectric layer 29 as a mask, where the top of the p-type nitride layer 30 is not higher than the nitride transition layer 28.

In this step, the p-type nitride is formed only in the region which is not covered with the dielectric layer 29 by taking the dielectric layer 29 as a mask, and thus the selective growth of the p-type nitride is achieved. In another aspect, since different impurities may be introduced during the process of the selective growth, it is difficult to control the doping concentration. For example, silicon atoms in the dielectric layer may be doped into GaN:Mg by diffusion effect. The silicon atom is a shallow donor in the gallium nitride, and thus it may make the epitaxial layer to be an n-type semiconductor. To avoid this diffusion, the second gallium nitride layer 27 is intended to be grown to have a thickness greater than 10 nm, greater than 30 nm, or even greater than 120 nm. Therefore, the second gallium nitride layer 27 can not only make the epitaxial film heterojunction stable, but also can prevent the silicon atoms from diffusing into the p-type gallium nitride. And a gate electrode structure having a "T" shape may be obtained by controlling the growth thickness.

The p-type nitride layer 30 according to this embodiment is aluminum indium gallium nitride or gallium nitride. The p-type nitride layer 30 may be formed by chemical vapor deposition. The first gallium nitride layer 25 can protect the first aluminum gallium nitride layer 24 underneath from being damaged due to stress relaxation at high temperature.

Figure 5D:
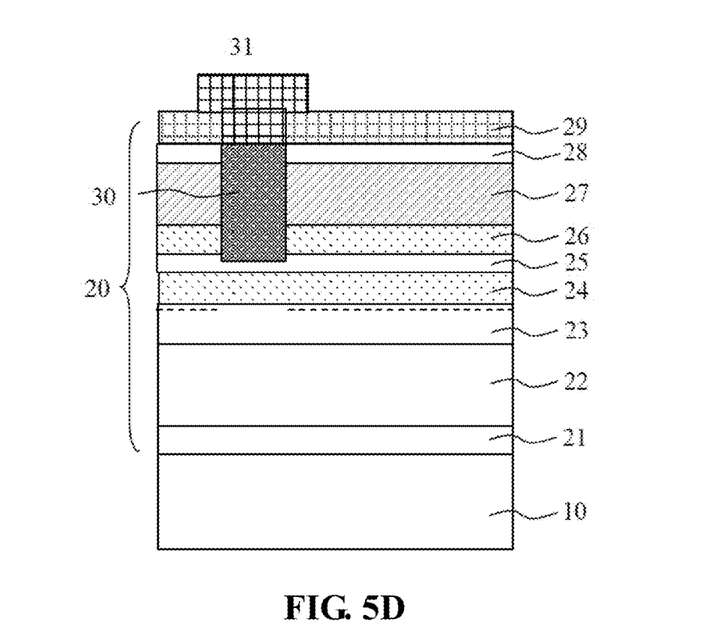
Figure 6A:
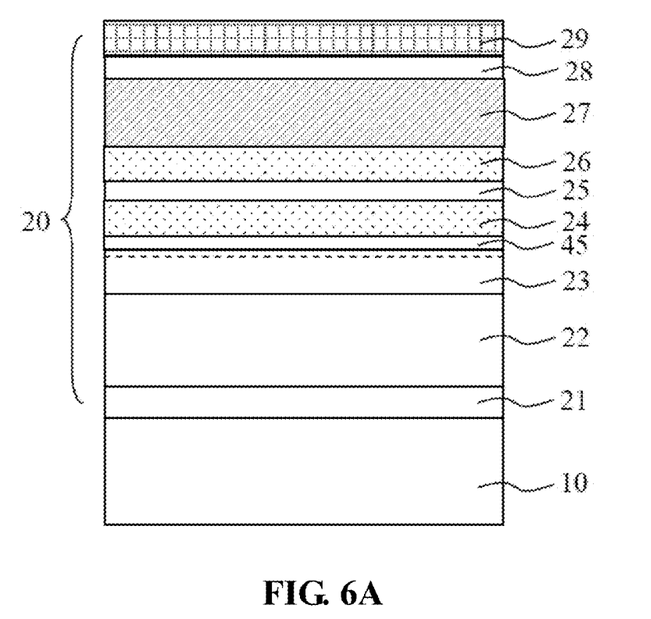
FIG. 6A to FIG. 6D are flow diagrams of a method for fabricating the enhancement-mode device according to the second embodiment of the present disclosure.
Figure 6B:
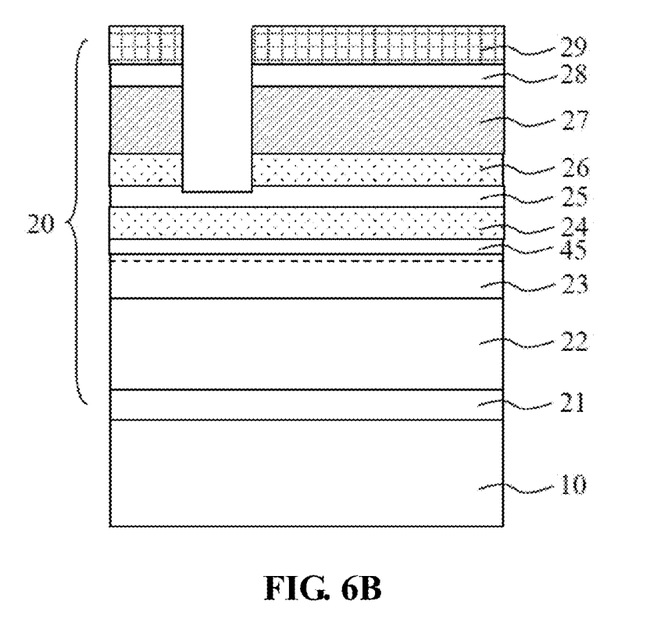
Figure 6C:
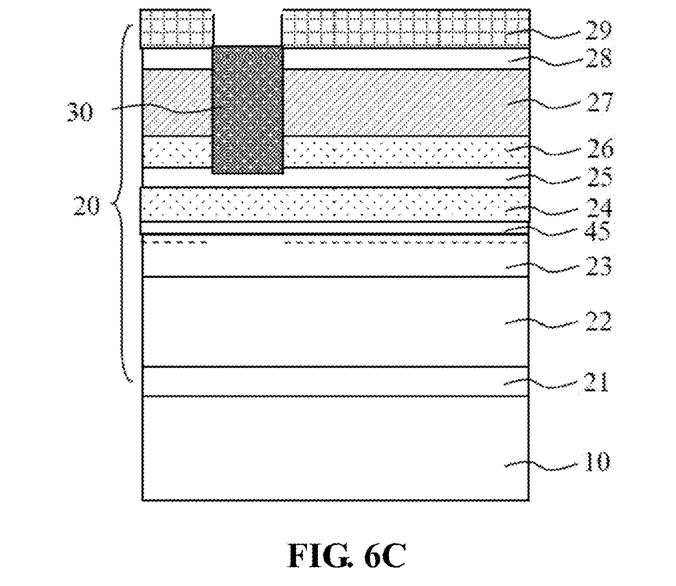
Figure 6D:
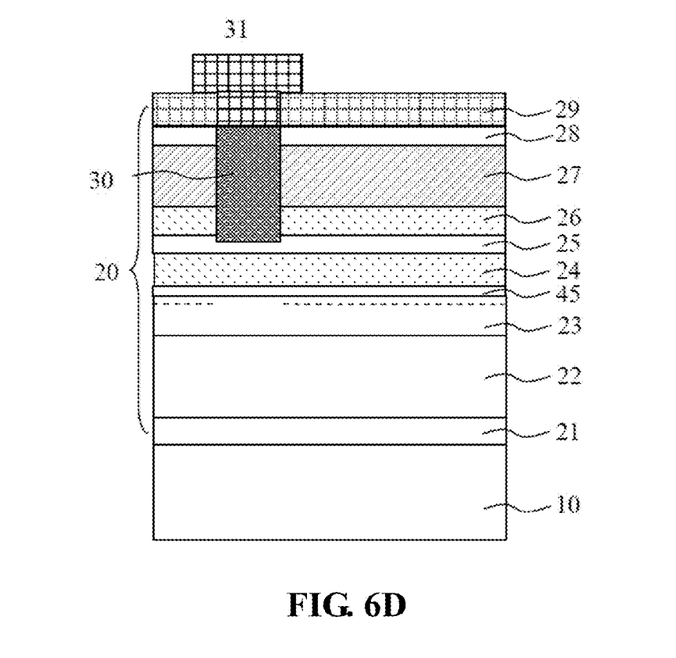

In step S14: as shown in FIG. 5D, a gate metal layer is deposited in the gate region to form a gate electrode. The gate metal layer may be made to have a "T" shape by controlling the thickness of the dielectric layer 29 and the second gallium nitride layer 27.

It should be noted that in this embodiment, the first aluminum gallium nitride layer 24 and the second aluminum gallium nitride layer 26 are respectively the first outer layer and the second outer layer of the barrier layer of the sandwich structure. However, in other embodiments, the first outer layer may be an aluminum indium gallium nitride layer, and the second outer layer may be an aluminum indium gallium nitride layer. These may be combined depending on the specific situation.

Referring to FIG. 6A to FIG. 6D, which are state diagrams of a method for fabricating the enhancement-mode device according to the second embodiment of the present disclosure. In this embodiment, an aluminum nitride layer 45 is sandwiched between the gallium nitride channel layer 23 and the first aluminum gallium nitride layer 24, and the others are the same as the first embodiment, which is not described here.

In fabricating the structure of the enhancement-mode device, there are several key parameters needed to be considered, which includes the thickness, the hole concentration, and the composition of the p-type nitride, the thickness and the composition of the first aluminum gallium nitride layer, and the thickness and the composition of the second aluminum gallium nitride layer. The parameters are specifically determined by analysis below.

Figure 7:
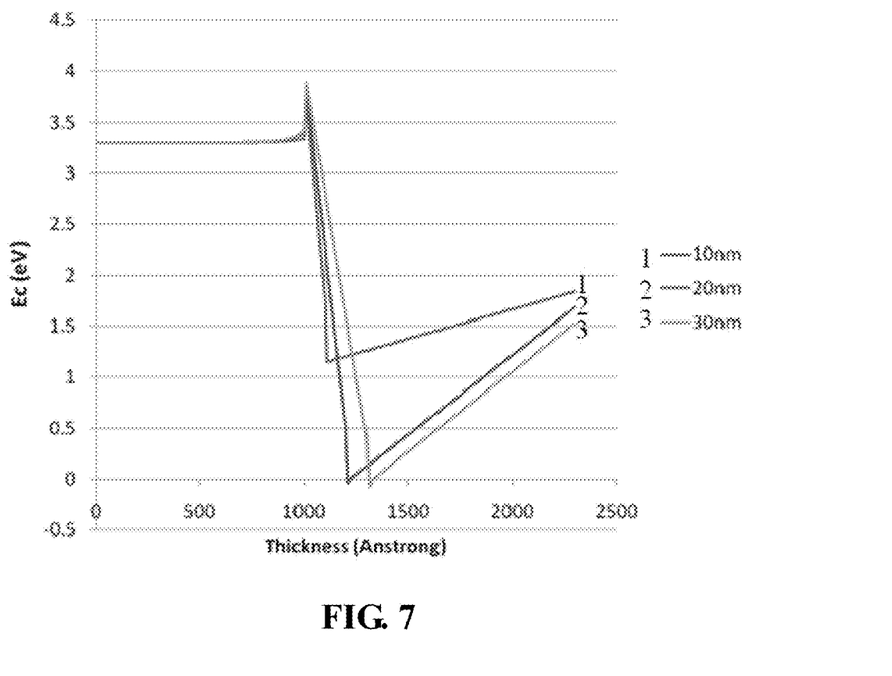
FIG. 7 is a band diagram with varied thicknesses of an aluminum gallium nitride layer.
Figure 8:
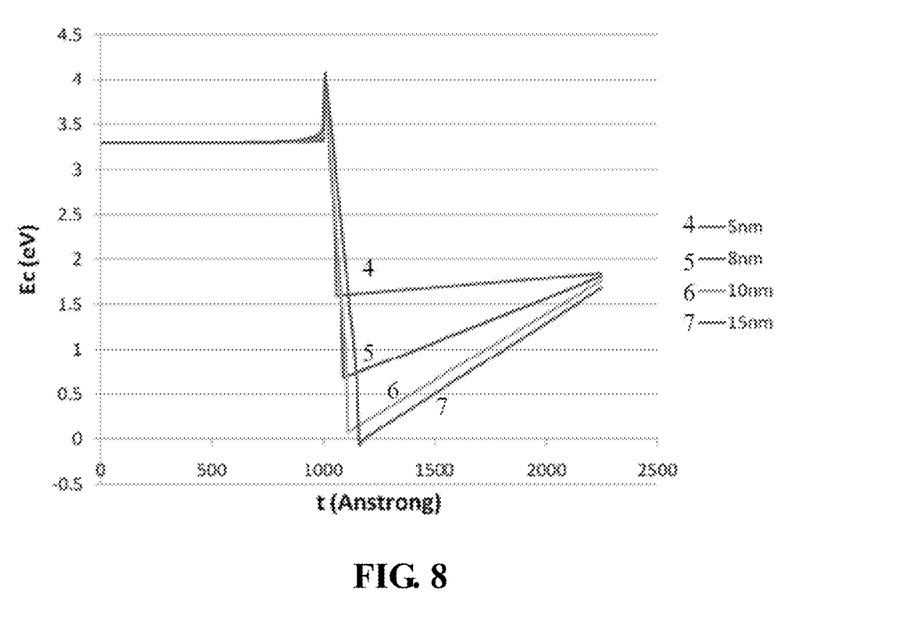
FIG. 8 shows an influence of the thickness of an aluminum gallium nitride layer having a content of aluminum of 30% on the band diagram.

To achieve an enhancement-mode device, it is necessary to ensure that the two-dimensional electron gas under the gate electrode is depleted. Thus, the composition and the thickness of the first aluminum gallium nitride layer are limited. For example, taking the first embodiment as an example, it is assumed that the content of aluminum in the first aluminum gallium nitride layer 24 is 20%, and the thickness of the first aluminum gallium nitride layer is varied from 5 nm to 20 nm. It is assumed that the p-type nitride is gallium nitride. The simulated band distribution is shown in FIG. 7. In the case that the thickness of the aluminum gallium nitride layer is larger than 20 nm, even if the hole concentration of the p-type gallium nitride is greater than $1E18/cm^3$, the two-dimensional electron gas is not depleted. In addition, taking the first embodiment as an example as well (as shown in FIG. 8), if the content of aluminum in the aluminum gallium nitride layer reaches 30%, the thickness of the aluminum gallium nitride layer cannot be larger than 10 nm, otherwise the enhancement-mode device can not be achieved even if the hole concentration of the p-type gallium nitride is $1E18/cm^3$. Therefore, it is necessary to control the thickness of the aluminum gallium nitride layer to be less than 15 nm, or even less than 10 nm.

Figure 9:
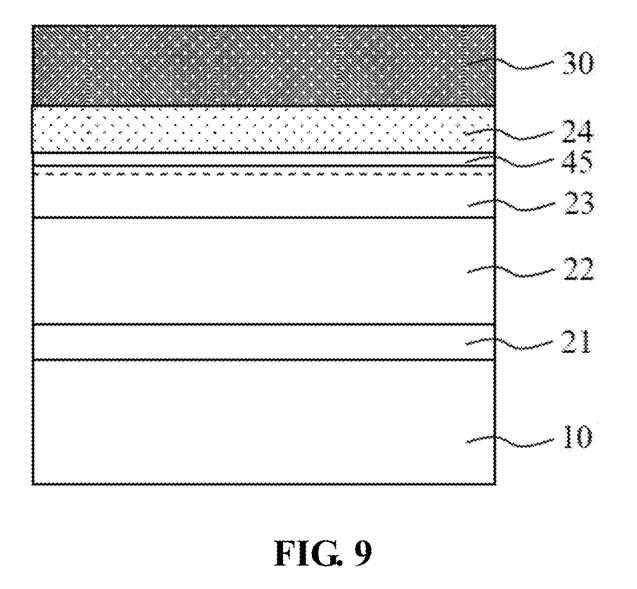
FIG. 9 is a schematic structural diagram of an assumed epitaxial layer for calculating an influence of the thickness of a surface gallium nitride layer.
Figure 10:
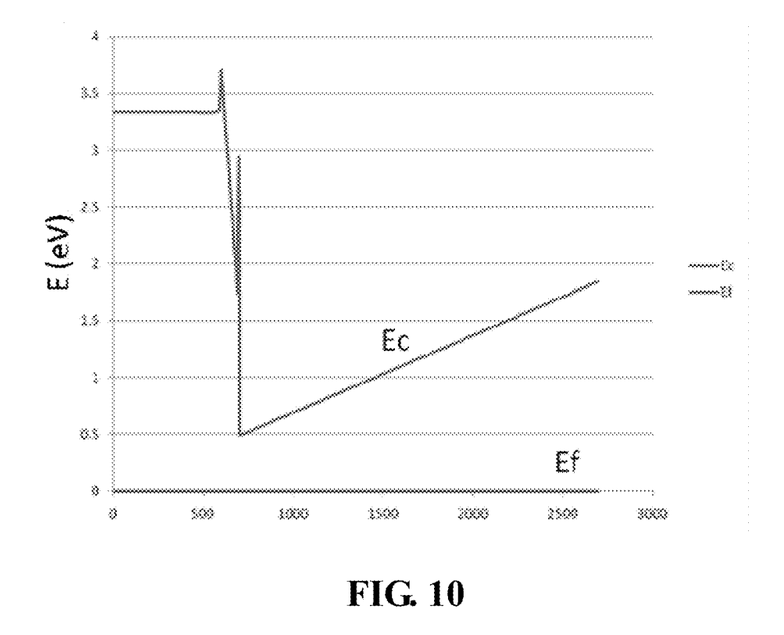
FIG. 10 is a simulated result illustrating the influence of the thickness of a gallium nitride layer when an aluminum nitride is present.

The thickness of the p-type nitride selectively grown in the gate region is larger than a certain thickness value, such as larger than 10 nm, larger than 30 nm, larger than 60 nm, or even larger than 120 nm, in order to deplete the two-dimensional electron gas under the gate region. It is assumed that the epitaxial multilayer structure is shown in FIG. 9 (such as the transition layer and the passivation layer which has little influence on the calculation are omitted in this epitaxial multilayer structure), p-type gallium nitride having a thickness of 50 nm is grown on the AlGaN/GaN in which the content of aluminum is 20%; and it is assumed that the hole concentration of the p-type gallium nitride is $5E17/cm^3$; an aluminum nitride layer having a thickness of 0.5 nm is embedded between the gallium nitride channel layer and the $Al_{0.2}Ga_{0.8}N$ barrier layer which has a thickness of 10 nm. It is indicated by the calculation result that the two-dimensional electron gas under the p-type gallium nitride is depleted, as shown in FIG. 10.

It can be seen from the above calculation that the critical parameters for achieving the enhancement-mode device are the thickness of the aluminum gallium nitride layer and the content of aluminum. To ensure that the two-dimensional electron gas is depleted, it is necessary to ensure that the thickness of the aluminum gallium nitride layer is as thin as possible and the content of aluminum is as low as possible. For example, in the case that the content of aluminum in the aluminum gallium nitride layer is 20%, the thickness of the aluminum gallium nitride layer cannot be larger than 15 nm; and in the case that the content of aluminum in the aluminum gallium nitride layer reaches 30%, the thickness of the aluminum gallium nitride layer may be not larger than 10 nm. The hole concentration of the p-type gallium nitride has little influence.

In summary, an enhancement-mode device and the method for fabricating the enhance device are provided in the present disclosure, the present disclosure has the following advantages over the conventional technology.

1. The barrier layer of aluminum gallium nitride in the heterojunction structure layer of AlGaN/GaN is designed to have a sandwich structure in which the gallium nitride layer is provided between the two aluminum gallium nitride layers, the lower aluminum gallium nitride layer is protected from being damaged during the etching process by taking the gallium nitride layer as a selective etching stop layer. In addition, the gallium nitride layer has a function of protection during the selective growth process later, to make the p-type nitride to be grown on the gallium nitride layer. Not only the lower aluminum gallium nitride layer is protected from being damaged stress relaxation at high temperature, but also the influence of defects caused during the growing process on the lower aluminum gallium nitride layer is avoided.

2. Since the gallium nitride layer having a great thickness is grown above the heterojunction, not only the epitaxial film heterojunction is made to be stable, but also the silicon atoms can be prevented from diffusing into the p-type gallium nitride. And a gate structure having a "T" shape may be obtained by controlling the growth thickness.

The above description of the disclosed embodiments enables those skilled in the art to implement or utilize the present disclosure. It will be apparent for those skilled in the art to modify the embodiments in various ways. The general principles defined herein can be implemented in other embodiments without departing from the spirit and the scope of the present disclosure. Therefore, the present disclosure is not limited by these embodiments shown herein, but includes the broadest scope consistent with the principles and the novelty features disclosed herein.

The invention claimed is:

1. An enhancement-mode device, comprising a substrate, an epitaxial multilayer structure formed on the substrate, and a gate region formed on the epitaxial multilayer structure, wherein:
   the epitaxial multilayer structure sequentially comprises from the substrate: a nucleation layer, a buffer layer, a heterojunction structure layer, a second gallium nitride layer, a nitride transition layer and a dielectric layer, wherein the heterojunction structure layer comprises a gallium nitride channel layer and a barrier layer which has a sandwich structure, wherein a middle layer of the sandwich structure is a first gallium nitride layer, and a material of a second outer layer of the sandwich structure far away from the gallium nitride channel layer comprises at least one of aluminum, gallium nitride and indium; and
   the gate region comprises a gate metal layer and a p-type nitride layer located under the gate metal layer, wherein the p-type nitride layer is embedded into the epitaxial multilayer structure, a bottom of the p-type nitride layer is in contact with the first gallium nitride layer of the sandwich structure, and a top of the p-type nitride layer is not higher than the nitride transition layer.

2. The enhancement-mode device according to claim 1, wherein an aluminum nitride layer is provided between the barrier layer and the gallium nitride channel layer.

3. The enhancement-mode device according to claim 1, wherein a first outer layer of the sandwich structure close to the gallium nitride channel layer is one of an aluminum gallium nitride layer and an aluminum indium gallium nitride layer; and the second outer layer of the sandwich structure far away from the gallium nitride channel layer is one of an aluminum gallium nitride layer and an aluminum indium gallium nitride layer.

4. The enhancement-mode device according to claim 3, wherein a composition of aluminum in the first outer layer is less than 30% and a thickness of the first outer layer is less than 10 nm.

5. The enhancement-mode device according to claim 3, wherein a composition of aluminum in the first outer layer is less than 20% and a thickness of the first outer layer is less than 15 nm.

6. The enhancement-mode device according to claim 1, wherein a thickness of the second gallium nitride layer is larger than 10 nm.

7. The enhancement-mode device according to claim 1, wherein the gate metal layer has a "T" shape.

8. The enhancement-mode device according to claim 1, wherein the p-type nitride is aluminum indium gallium nitride, indium gallium nitride or gallium nitride.

9. The enhancement-mode device according to claim 1, wherein the substrate is made of one of sapphire, silicon carbide, silicon, lithium niobate, silicon-on-insulator, gallium nitride and aluminum nitride.

10. The enhancement-mode device according to claim 1, wherein the dielectric layer is one of SiN, $SiO_2$, SiON, $Al_2O_3$, $HfO_2$ and $HfAlO_x$, or a combination thereof.

11. The enhancement-mode device according to claim 1, wherein the second gallium nitride layer is an undoped layer, an n-type doped layer or an n-type locally-doped layer.

12. A method for fabricating an enhancement-mode device having the structure according to claim 1, wherein the method comprises:
   1) forming sequentially, on the substrate, the nucleation layer, the buffer layer, the gallium nitride channel layer, a first outer layer, the first gallium nitride layer, a second outer layer, the second gallium nitride layer, the nitride transition layer and the dielectric layer to form the epitaxial multilayer structure, and a material of a second outer layer of the sandwich structure far away from the gallium nitride channel layer comprises at least one of aluminum, gallium nitride and indium;
   2) etching locally the epitaxial multilayer structure to expose the first gallium nitride layer by taking the first gallium nitride layer as an etching stop layer to form the gate region;
   3) forming the p-type nitride layer in the gate region through a selective area growth using the dielectric layer as a mask layer, wherein the bottom of the p-type nitride layer is in contact with the first gallium nitride layer of the sandwich structure, and the top of the p-type nitride layer is not higher than the nitride transition layer; and
   4) depositing the gate metal layer in the gate region to form a gate electrode.

13. The method for fabricating the enhancement-mode device according to claim 12, wherein an aluminum nitride layer is provided between the barrier layer and the gallium nitride channel layer.

14. The method for fabricating the enhancement-mode device according to claim 12, wherein a first outer layer is one of an aluminum gallium nitride layer and an aluminum indium gallium nitride layer; and the second outer layer is one of an aluminum gallium nitride layer and an aluminum indium gallium nitride layer.

15. The method for fabricating the enhancement-mode device according to claim 12, wherein a composition of aluminum in the first outer layer is less than 30% and a thickness of the first outer layer is less than 10 nm.

16. The method for fabricating the enhancement-mode device according to claim 12, wherein a composition of aluminum in the first outer layer is less than 20% and a thickness of the first outer layer is less than 15 nm.

17. The method for fabricating the enhancement-mode device according to claim 12, wherein a thickness of the second gallium nitride layer is greater than 10 nm.

18. The method for fabricating the enhancement-mode device according to claim 12, wherein the gate metal layer has a "T" shape.

19. The method for fabricating the enhancement-mode device according to claim 12, wherein the p-type nitride is aluminum indium gallium nitride, indium gallium nitride or gallium nitride.

20. The method for fabricating the enhancement-mode device according to claim 12, wherein the substrate is made of one of sapphire, silicon carbide, silicon, lithium niobate, silicon-on-insulator, gallium nitride and aluminum nitride.

* * * * *